United States Patent [19]

Kleyer

[11] Patent Number: 5,350,598
[45] Date of Patent: Sep. 27, 1994

[54] APPARATUS AND METHOD FOR SELECTIVELY COATING A SUBSTRATE IN STRIP FORM

[75] Inventor: Siegfried Kleyer, Hainburg, Fed. Rep. of Germany

[73] Assignee: Leybold Aktiengesellschaft, Hanau, Fed. Rep. of Germany

[21] Appl. No.: 166,456

[22] Filed: Dec. 13, 1993

[30] Foreign Application Priority Data

Mar. 27, 1993 [DE] Fed. Rep. of Germany ....... 4310085

[51] Int. Cl.$^5$ ............................................. C23C 16/04
[52] U.S. Cl. ................... 427/255.5; 427/251; 427/259; 118/718; 118/720; 118/726; 118/733
[58] Field of Search ............... 118/718, 720, 726, 733; 427/251, 255.5, 255.7, 259

[56] References Cited

U.S. PATENT DOCUMENTS

| 2,971,862 | 2/1961 | Baer et al. | 118/718 |
| 2,996,037 | 8/1961 | Eng | 118/718 |
| 3,227,132 | 1/1966 | Clough et al. | 118/733 |
| 4,478,878 | 10/1984 | Neuwald | 427/79 |
| 4,832,983 | 5/1989 | Nagatomi et al. | 427/81 |
| 4,864,967 | 9/1989 | Kleyer | 118/718 |
| 4,953,497 | 9/1990 | Kessler | 118/718 |
| 4,962,725 | 10/1990 | Heinz et al. | 118/718 |
| 4,979,468 | 12/1990 | Kleyer | 118/718 |
| 5,223,038 | 6/1993 | Kleyer | 118/718 |
| 5,254,169 | 10/1993 | Wenk | 118/733 |

FOREIGN PATENT DOCUMENTS

| 2112405 | 9/1972 | Fed. Rep. of Germany . | |
| 2234510 | 1/1974 | Fed. Rep. of Germany . | |
| 38-12164 | 7/1963 | Japan | 427/251 |
| 61-110343 | 5/1986 | Japan | 118/718 |

Primary Examiner—Terry J. Owens
Attorney, Agent, or Firm—Felfe & Lynch

[57] ABSTRACT

A drum is provided on its surface with depressions corresponding to the portions of a web not to be coated and is partially enclosed by a chamber in which separating agent is evaporated. The depressions capture vapor as the drum is rotated, and the web is passed over the drum where it is not enclosed by the chamber. Separating agent condenses on selective of the web correspond to the depressions, and a functional coating is subsequently applied. Thereafter the functional coating is removed from the areas where the separating agent was applied.

13 Claims, 3 Drawing Sheets

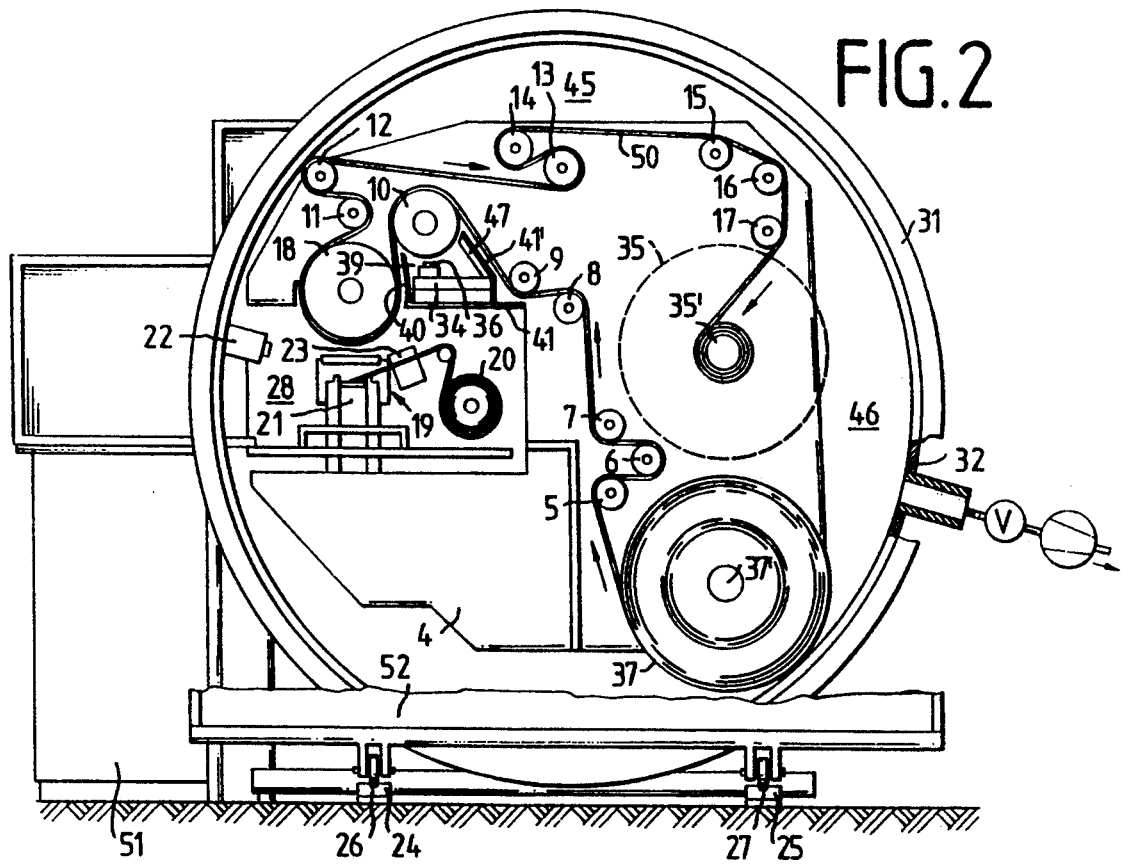

APPARATUS AND METHOD FOR SELECTIVELY COATING A SUBSTRATE IN STRIP FORM

BACKGROUND OF THE INVENTION

The invention relates to a method and an apparatus for producing patterns on substrates by coating the substrates spot-wise with a medium blocking a subsequent coating, and by the subsequent application of at least one functional coating.

U.S. Pat. No. 4,832,983 discloses a method for the metallization of plastic films, in which the film web is guided over a rotatable rubber roll whose cylindrical surface is provided with the desired relief pattern. The individual elements of the pattern raised above the cylindrical surface have an oil film on their surface which, by rolling on the film, produces the oil film imprints corresponding to the pattern. The film provided with the oil pattern is then passed over a cooled roll and at the same time vapor-coated, the metal vapor depositing itself on the oil-free areas of the film.

DE-OS 22 34 510 discloses a method for metallizing a film of insulating material serving for the manufacture of electrical condensers by continuous vapor depositing by the pass-through process. The elongated film wound on a roll is continuously unwound in an evacuated apparatus, carried past a source delivering the metal vapor in a vapor deposition area, and then rewound in the metallized state. The film unwound from the roll is introduced into the vapor deposition area in the preheated state.

DE-OS 21 12 405 discloses an apparatus for vapor coating a film intended especially for the manufacture of condensers having one or more metallized and one or more non-metallized longitudinal stripes. An oil vaporizer with one or more nozzles is disposed, as seen in the direction of movement of the film, ahead of an apparatus for vapor-depositing metal. The oil vaporizer has a base heater and at least one device for fast-response temperature control with a relatively narrow range of action, which is controlled according to the width of the non-metallized stripes on the film.

U.S. Pat. No. 4,478,878 discloses a method for the production of metal-free stripes in the vapor coating of a web of insulating material intended for use in electric condensers, wherein the insulating web is masked in the area of the metal-free stripes by an endless masking web running in contact with it at the same speed. Before entering the vapor-coating zone the masking web is coated with oil on the side facing the metal vaporizer. After passing through the vapor-coating zone, and after the separation of the masking web and the insulating material web, the masking web is wiped free of the vapor-deposited metal.

Lastly, U.S. Pat. No. 5,223,038 discloses an apparatus for the production of metal-free strips which has a hermetically sealable housing in which there is provided a system for receiving and driving a film web, especially for condensers. A vaporizing source with at least one nozzle discharges the substance to be vaporized to prevent condensation on the moving film web, the nozzle being formed of at least one opening extending approximately over the entire width of the film web.

The known methods and apparatus have the disadvantage that selectable patterns of separating agent cannot be printed on the films, or else the uniformity of the applied film of separating agent is inadequate, so that the contours of the areas on which the metal deposits itself lack sharpness. Also, there is no assurance that the parting agent will not wet additional areas of the film web which are to be coated with metal.

SUMMARY OF THE INVENTION

The present invention is addressed to coating plastic films with any desired configuration. The metallized areas are to have great sharpness of contour, and the danger of separating agent creeping or otherwise getting onto the areas to be coated is also to be prevented. Lastly, the speed with which the film web is coated is to be widely variable.

According to the invention, an intaglio pattern is provided on a pattern bearing surface in which the distribution of the depressions corresponds to the surface areas of the substrate that are not to be coated. The depressions are filled with vapor of a medium that prevents coating, and the substrate is driven substantially in synchronism with the pattern bearing surface, the open sides of the depressions facing the substrate surface and thus causing the vapor contained in the depressions to condense onto the substrate. After condensation the substrate is provided with at least one functional coating.

The invention admits of a great variety of embodiments; one of them is only schematically represented in the appended drawings.

BRIEF DESCRIPTION OF THE DRAWINGS

FIG. 1 is a top plan view of a part of a web coating apparatus whose winding system has been extended axially out of the coating chamber for the loading procedure. Some of the idler and tension rollers are not represented.

FIG. 2 is a side view of the apparatus, in the section taken along lines 2—2 in FIG. 1.

DETAILED DESCRIPTION OF THE PREFERRED EMBODIMENT

Figure 3:
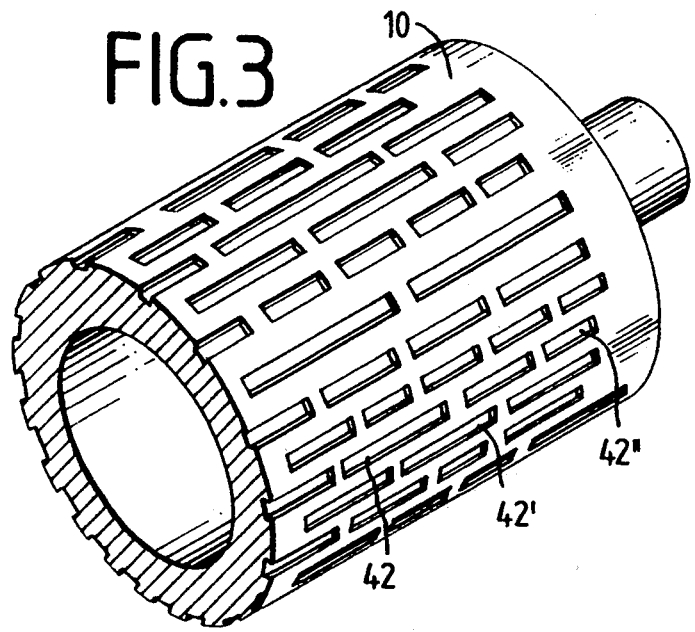
FIG. 3 is a cutaway perspective of the pattern bearing roller for wetting the film with separating agent.

Referring to FIGS. 1 and 2, the web coating apparatus includes idler, tension measuring, stretching and tightening rolls 5-9 and 11-17, cooled coating cylinder 18, supply roll 37', take-up roll 35', pattern bearing roller 10, evaporating source 19 with aluminum wire coil 20, evaporator crucible 21, and a video camera 22 for observing the coating process. The two plates 3 and 4 fastened on the supporting frame 52 can be moved into and out of the coating chamber 28 in the direction of arrow R on the wheels 26 and 27 riding on rails 24 and 25, together with rollers 5 to 9 and 11 to 17 and the coating roller 18 which form the winding system. When the winding system 29 is driven in, the disk-like cover 30 fixedly mounted on the supporting frame 52 applies its marginal area against the flanged end 31 of the hollow cylinder 32, and is held there by clamps (not shown), or it is drawn against the end 31 by the atmospheric pressure due to the vacuum prevailing in chamber 45 during the working phase.

Figure 4:
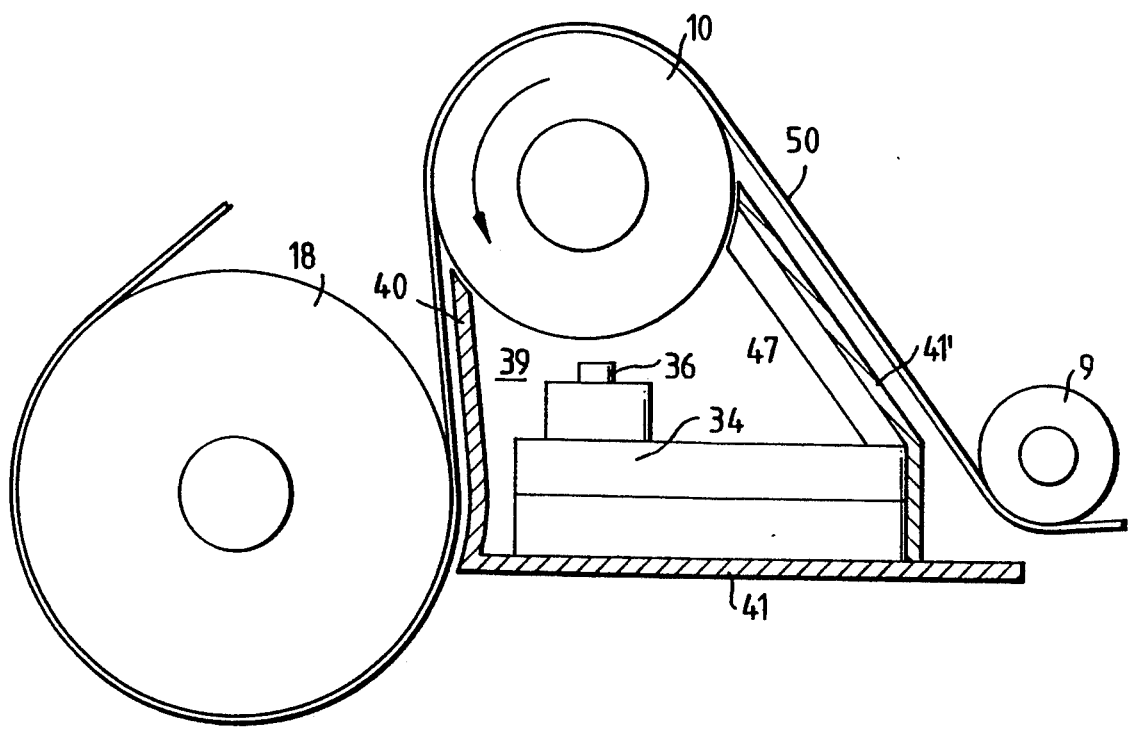
FIG. 4 is a side view of the separating agent vaporizer and of the pattern bearing roller of FIG. 2, but on a larger scale.

Referring also to FIG. 4, a vaporizing tank 34 is formed from a hollow shape whose both ends are sealed by end pieces. Inside of the tank 34 there is a rod-like heating element that is completely immersed in the separating agent. The vaporized separating agent passes through a strip of nozzles 36 toward the pattern bearing roller 10. A wiper or squeegee 47 assures that the separating agent remains in the depressions 42 on the circumference of the pattern bearing roller 10.

The vaporizing tank 34 is disposed in a chamber 39 which is at a pressure which prevents the separating agent from condensing in this area, the chamber 39 being defined on the one hand by the squeegee 47 and the walls 40, 41, 41', and on the other hand by the pattern bearing roller 10. The vaporizing tank 34 is held by means of the two plates 3 and 4, so that the stream issuing from the nozzle 36 is aimed at the surface to be wetted on the pattern bearing means 10. It is also desirable to equip the tank 34 with a temperature sensor permitting the separating agent temperature to be precisely monitored and controlled (the circuit necessary for monitoring and controlling the heating circuit is not shown in the drawing).

As FIG. 2 shows, the nozzle 36 is disposed at a section of the web path 50 which is located in the immediate vicinity of the coating roller 18, so that the actual coating process takes place immediately after the moving web 50 has been wetted. It is to be understood that the metal vaporized in the crucible 21 cannot deposit itself on the areas of the film web 50 that have been wetted by the separating agent (a silicone oil, for example), so that the areas of the film web 50 that remain uncoated depend upon the number and size and on the configuration of the depressions 42 on the pattern bearing roller 10.

In the apparatus represented in FIGS. 1 and 2, the rollers 5 to 9 for driving and guiding the film web 50 are arranged so that the part of the film web 50 that is directly in front of the coating roller 18 runs at a steep angle, i.e., almost perpendicularly downward from the pattern bearing means 10.

It is obvious that this part of the film web 50 can also be guided differently; for example it can run onto the coating roller 18 on an approximately horizontal plane without the need to change the position and size of the pattern bearing roller shown in detail in FIG. 3 for the application of the separating agent.

As FIG. 3 shows, the pattern bearing roller 10 is configured as a hollow cylinder, and the individual depressions 42 create a pattern. The separating agent vapor issuing from the nozzle plate fills the space 39 and thus also the depressions 42 which open toward the chamber. Since the pattern bearing roller 10 rotates in the direction of the arrow, the wall portion 41' in the form of the sealing plate 47 and the wall portions 40 and 41 prevent the excess vapor, i.e., the vapor not collected in the pattern of depressions, from being carried toward the film web 50. Since then the pattern bearing roller 10, as it continues to turn, comes in contact with the film web 50, the separating agent vapor condenses on the film web 50, leaving the pattern corresponding to the depression pattern on the surface of the film web 50.

Figure 5:
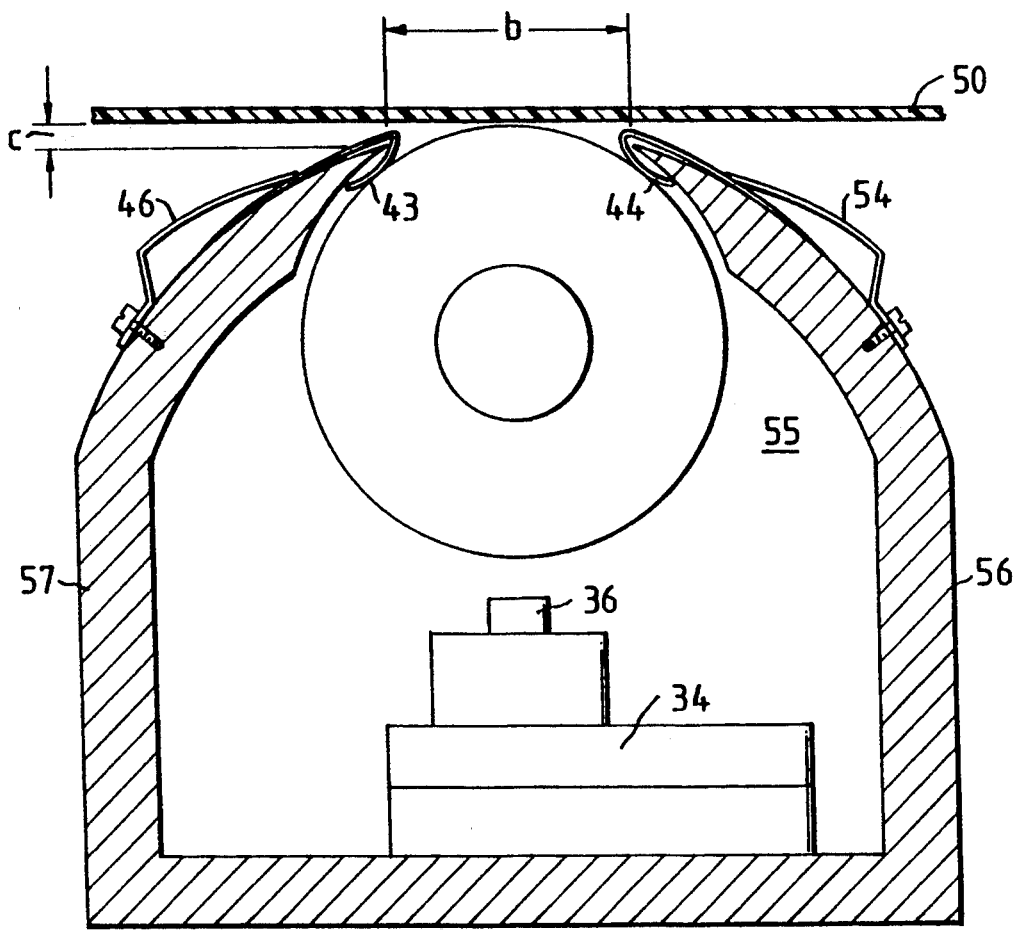
FIG. 5 is a side view of an alternate embodiment in which the film web does not wrap around the pattern bearing means but passes it at a short distance away.

FIG. 5 shows an embodiment of a vapor depositing system in which the film web 50 does not wrap around the pattern but passes in the immediate vicinity of the housing opening b, while the sealing strips 43 and 44 are configured as resilient curved strips which are pressed against the pattern bearing means 10 by the leaf springs 46 and 54, so that only the separating agent contained in the cup-like depressions is transferred to the film web 50. Precisely as in the case of the vaporizer represented in FIG. 4, the space 55 between the sealing strips 43 and 44 and the vaporizing tank 34 is at a higher pressure than the space above the opening b.

I claim:

1. Apparatus for selectively coating a web, said apparatus comprising
   a chamber,
   a source of vaporized separating agent in said chamber,
   a rotatable drum having a cylindrical surface which is partially enclosed by said chamber and partially exposed from said chamber, said surface having a pattern of depressions which collect vaporized separating agent as said surface rotates through said chamber,
   sealing means for retaining excess vaporized separating agent in said chamber,
   means for passing a web over said partially exposed surface as said drum is rotated, whereby vaporized separating agent can condense on selective areas of said web corresponding to said depressions, and
   means for coating said web including said selective areas.

2. Apparatus as in claim 1 wherein said means for coating comprises a source of evaporated metal.

3. Apparatus as in claim 1 wherein said source of vaporized separating agent comprises discharge nozzle means.

4. Apparatus as in claim 3 wherein said discharge nozzle means comprises a slot for discharging vaporized separating agent.

5. Apparatus as in claim 3 wherein said discharge nozzle means comprises a row of holes for discharging vaporized separating agent.

6. Apparatus as in claim 1 wherein said chamber comprises wall means having an opening which is closed by said cylindrical surface of said drum, and sealing means effective between said wall means and said cylindrical surface.

7. Apparatus as in claim 1 further comprising guide means which guide said web against said cylindrical surface of said drum over a circumferential portion where said web is exposed from said chamber.

8. Apparatus as in claim 1 further comprising means for guiding said web over said partially exposed surface at a distance from said surface.

9. Method for selectively coating a web, comprising
   providing a chamber,
   providing a rotatable drum having a cylindrical surface which is partially enclosed by said chamber and partially exposed from said chamber, said surface having a pattern of depressions,
   exposing said partially enclosed surface in said chamber to a vaporized separating agent,
   rotating said drum so that said surface has a surface speed,
   moving a web past said partially exposed surface synchrously with said surface speed so that vaporized separating agent condenses on selective areas of said web corresponding to said depressions.

10. Method as in claim 9 wherein said web is passed against said cylindrical surface of said drum over a circumferential portion where said web is exposed from said chamber.

11. Method as in claim 9 further comprising coating said web including said selective areas.

12. Method as in claim 9 wherein said coating is done by evaporating metal.

13. Method as in claim 11 wherein said coating and said separating agent are subsequently washed from said selective areas.

* * * * *